United States Patent [19]
Sumida

[11] Patent Number: 5,572,055
[45] Date of Patent: Nov. 5, 1996

[54] INSULATED-GATE BIPOLAR TRANSISTOR WITH REDUCED LATCH-UP

[75] Inventor: Hitoshi Sumida, Kawasaki, Japan

[73] Assignee: Fuji Electric Co., Ltd., Kanagawa, Japan

[21] Appl. No.: 491,517

[22] Filed: Jun. 19, 1995

Related U.S. Application Data

[63] Continuation of Ser. No. 145,848, Nov. 5, 1993, abandoned.

[30] Foreign Application Priority Data

Nov. 9, 1992 [JP] Japan ..................... 4-297500
Jun. 15, 1993 [JP] Japan ..................... 5-142413

[51] Int. Cl.$^6$ ..................... H01L 29/76; H01L 29/74; H01L 29/94
[52] U.S. Cl. ..................... 257/343; 257/133; 257/141; 257/162; 257/378
[58] Field of Search ..................... 257/133, 139, 257/140, 141, 162, 146, 147, 155, 339, 343, 409, 212, 378

[56] References Cited

U.S. PATENT DOCUMENTS

| | | | |
|---|---|---|---|
| 5,155,562 | 10/1992 | Tsuchiya | 257/343 |
| 5,198,688 | 3/1993 | Tsuchiya et al. | 257/212 |
| 5,329,142 | 6/1994 | Kitigawa et al. | 257/139 |
| 5,349,224 | 9/1994 | Gilbert et al. | 437/913 |

FOREIGN PATENT DOCUMENTS

| | | | |
|---|---|---|---|
| 0372391 | 6/1990 | European Pat. Off. | 257/139 |
| 1-198076 | 8/1989 | Japan | 257/330 |

OTHER PUBLICATIONS

P. V. Gilbert et al., Proc. 5th Intl. Symp. Power Semic. Devices and IC's (ISPSD '93), May 18–20, 1993, p. 240, "A fully intergrable IGBT with a trench gate structure" (Abstract).
B.–H. Lee et al., Jpn. J. Appln. Phys., 34 (2B) (1995) 854, "A trench–gate SOI lateral IGBT with p+ cathode well".
"Performance of 200 V CMOS Compatible Auxiliary Cathode Lateral Insulated Gate Transistors", Narayanan et al., IEEE, pp. 103–108, 1991.

Primary Examiner—Steven H. Loke
Attorney, Agent, or Firm—Finnegan, Henderson, Farabow, Garrett & Dunner, L.L.P.

[57] ABSTRACT

An insulated-gate bipolar transistor includes a semiconductor region of a first conductive type; a base layer of a second conductive type diffused from a surface of the semiconductor region; a source layer of the first conductive type diffused in a surface portion of the base layer; an insulated gate buried in a recess dug from the surface of the source layer through the base layer up to the semiconductor region; a collector layer of the second conductive type diffused from a surface of the semiconductor region on an opposite side of the insulated gate with respect to the source layer; an emitter terminal drawn from the base layer and the source layer; a collector terminal drawn from the collector layer; and a gate terminal drawn from the insulated gate.

9 Claims, 6 Drawing Sheets

INSULATED-GATE BIPOLAR TRANSISTOR WITH REDUCED LATCH-UP

This application is a continuation of application Ser. No. 08/145,848 filed Nov. 5, 1993, now abandoned.

BACKGROUND OF THE INVENTION

The present invention relates to a horizontal insulated-gate bipolar transistor (hereinafter called "IGBT") suitable for, for example, being incorporated in an integrated circuit device, and a process of producing the same.

As is well known, IGBTs feature high input impedance retained by insulated gates and low output impedance by bipolar transistors in combination, and have become widely employed as high-voltage, large-current transistors for uses in which extremely high frequency characteristics are not particularly required. Heretofore, IGBTs have normally been utilized in the form of separate elements of vertical structure, but with the trend for power devices to be made with so-called intelligence, there are increase demands for fabricating a plurality of IGBTs together with relevant control circuits into one integrated circuit device. Since the planar structure is advantageous for integration, horizontal IGBTs are often employed.

The simplest way of fabricating a horizontal IGBT is to relocate the rear structure of a conventional chip of vertical structure onto its surface side. FIG. 1 is a sectional view showing a unit structure of a typical conventional horizontal IGBT. A chip or wafer for an integrated circuit is usually prepared by, for example, growing an n-type epitaxial layer 2 on a p-type semiconductor substrate 1 and the horizontal IGBT is made by repeatedly fabricating the unit structure U on both left and right sides with the epitaxial layer 2 as a semiconductor region for the IGBT.

The central portion of FIG. 1 is similar to that of vertical structure. A p-type base layer 3 and a base contact layer 4 with a high impurity concentration are diffused from the surface of an n-type semiconductor region 2 and a polycrystalline silicon gate 5 is disposed via a gate oxide film 5a on both peripheral edge portions of the base layer 3. Simultaneously, an n-type source layer 6 with a high impurity concentration is diffused to be buried under the insulated gate 5 as shown in FIG. 1. Then aluminum electrode films 9 are used to short the p-type base contact layer 4 and the n-type source layer 6 so as to form an emitter terminal E, and further a gate terminal G is connected to the insulated gate 5.

The left and right end portions of FIG. 1 correspond to the rear structure of a vertical structure chip. In this case, an n-type buffer layer 7 with relatively high impurity concentration is diffused from the surface of the semiconductor region 2 and a p-type collector layer 8 with high impurity concentration is diffused inside the former and further electrode films 9 are conductively connected to the surface of the latter to provide a collector terminal C. The collector layer 8 is normally fabricated by simultaneous diffusion as the p-type base contact layer 4 with high impurity concentration.

In the case of the horizontal IGBT of FIG. 1, a positive voltage with respect to the emitter terminal E is applied to the gate terminal G while a voltage is being applied across the emitter and collector terminals E and C. Then an n-type channel is formed on the surface of the p-type base layer 3 beneath the insulated gate 5 and electrons as majority carriers flow from the n-type source layer 6 via the semiconductor region 2 and the buffer layer 7 to the collector layer 8. When holes as minority carriers are reversely injected from the collector layer 8 via the buffer layer 7 into the semiconductor region 2, a bipolar transistor comprising the p-type base layer 3, the n-type semiconductor region 2 and the collector layer 8 is turned on with a base current of the holes, and due to the so-called conductivity modulation action originating from the electrons and holes in the semiconductor region 2, the main terminal E conducts to the main terminal C at an extremely low on-voltage. When the IGBT is turn off, the electrons flowing through the channel beneath the insulated gate 5 are cut off by applying a voltage equal to or more negative than that at the emitter terminal E to the gate terminal G. The buffer layer 7 is used for controlling the hole injection quantity from the collector layer 8 to the semiconductor region 2.

The aforesaid horizontal IGBT is rendered capable of withstanding higher voltage by widening the gap between the base layer 3 and the collector layer 8 and capable of passing larger current by increasing the number of unit structures U. Notwithstanding, the horisontal IGBT still poses a serious problem in that latch-up tends to easily occur as compared with the vertical structure. FIG. 2 shows an enlarged right-hand portion of FIG. 1 wherein flow paths of electrons e as majority carriers and holes h as minority carriers are illustrated. The electrons e flow from the source layer 6 through a channel beneath the insulated gate 5 and enter the semiconductor region 2. Then they flow along the surface of the semiconductor region and flow through the buffer layer 7 into the collector layer 8. On the other hand, the holes h are injected from the collector layer 8 via the buffer layer 7 into the semiconductor region 2, and due to the Coulomb's force from the electrons e, the holes pass in a range close to the surface and contribute to the conductivity modulation. Then the holes enter the base layer 3 and flow under the source layer 6 into the base contact layer 4.

As stated above, the holes h as minority carriers laterally flow through the base layer 3 beneath the source layer 6 in the horizontal IGBT, and as the current due to the holes h increases, they are injected into the source layer 6. Thus the pnpn four-layer thyristor structure existing among the p-type collector layer 8, the n-type semiconductor region 2, the p-type base layer 3 and the n-type source layer 6 tends to ignite to cause latch-up. The injection of the holes h into the source layer 6 like this easily occurs especially when an overvoltage is applied across the collector and emitter terminals C and E while the IGBT is in the off state. The reason for this is that when a voltage drop becomes greater due to the holes h laterally flowing through the base layer 3, since the emitter terminal E shorts the base layer 3 and the source layer 6, the potential at the place shown by I in FIG. 2 rises relatively and causes the pn junction at the place to be biased in the forward direction, thus making holes h readily injected. Accordingly, there are problems that an allowable current which is allowed to flow and the latch-up withstanding quantity considerably lower in the case of the horizontal IGBT in comparison with the vertical structure.

SUMMARY OF THE INVENTION

An object of the present invention is therefore to solve the foregoing problems to improve the latch-up withstanding quantity of a horizontal IGBT.

In order to accomplish the above object, an IGBT according to a first aspect of the present invention comprises a base layer of the other conductive type diffused from the surface of a semiconductor region of one conductive type, a source layer of one conductive type diffused in the surface portion of the base layer, an insulated gate buried in a recess dug from the surface of the source layer through the base layer up to the semiconductor region, and a collector layer of the other conductive type diffused from the surface of the semiconductor region on the opposite side of the insulated gate with respect to the source layer, wherein an emitter terminal is drawn from the base layer and the source layer, a collector terminal from the collector layer, and a gate terminal from the insulated gate.

The IGBT according to the first aspect of the present invention is also preferably arranged so that a base contact layer of the other conductive type is diffused on the surface side of the base layer so as to overlap the peripheral edge of the base layer and to contact with the source layer, and the emitter terminal is drawn from the base layer via the base contact layer. Further, the IGBT is also preferably arranged so that a buffer layer of one conductive type is diffused in such a way as to surround the collector layer. In order to further improve the latch-up withstanding quantity of this IGBT, it is also advantageously arranged in that an auxiliary collector layer of one conductive type is diffused in a diffusion pattern portion of the collector layer surrounding the leading end of the planar pattern of the source layer, or otherwise the auxiliary collector layer of one conductive type is diffused on the surface of semiconductor region in contact with the collector layer, the collector terminal being drawn from the collector layer and the auxiliary collector layer.

A process of producing the IGBT according to the first aspect of the present invention comprises the steps of diffusing a base layer of the other conductive type from the surface of a semiconductor region of one conductive type, diffusing a source layer of one conductive type in the surface of the base layer, digging an recess from the surface of the source layer through the base layer up to the semiconductor region, burying an insulated gate in the recess, and diffusing a collector layer of the other conductive type from the surface of the semiconductor region on a side of the base layer and the source layer. It is also advantageous to diffuse a base contact layer of the other conductive type on the surface side of the base layer simultaneously with the diffusion of the collector layer in such a way as to make the base contact layer overlap the peripheral edge of the base layer and contact with the source layer.

As shown in FIG. 2, in the conventional IGBT, the collector layer 8 has been disposed on the same side of the insulated gate 5 with respect to the source layer 6. On the other hand, the buried type insulated gate is provided according to the first aspect of the present invention, and the collector layer is disposed on the opposite side of the insulated gate with respect to the source layer. By directly extracting the minority carriers causing latch-up from the collector layer into the emitter terminal without allowing the carriers to laterally pass through the base layer beneath the source layer contrary to the conventional IGBT, the minority carriers are substantially completely prevented from being injected into the source layer to improve the latch-up withstanding quantity. With the provision of the base contact layer to connect the base layer to the emitter terminal, the effect of improving the latch-up withstanding quantity is further increased as most of the minority carriers can be extracted through only the base contact layer with high impurity concentration and low resistivity.

According to a second aspect of the present invention, a lateral insulated-gate bipolar transistor (IGBT) is prepared through the steps comprising: diffusing a base layer of the other conductive type from the surface of a semiconductor region of one conductive type, diffusing a base connection layer of the other conductive type on one side of the base layer in an overlapping manner, diffusing a source layer of one conductive type shallowly within a range including the surfaces of the base layer and the base connection layer and the boundary therebetween, disposing a gate in such a way as to cover the surface of the base layer on a side of the source layer, diffusing a collector layer of the other conducive type from the surface of the semiconductor region on one side of the base connection layer, and drawing an emitter terminal from the base connection layer and the source layer, a collector terminal from the collector layer, and a gate terminal from the gate.

In order to increase the off-action speed of the IGBT thus structured according to the second aspect of the present invention, it is advantageous to diffuse a collector short layer of one conductive type to the collector layer from the surface of the semiconductor region adjoining thereto and to draw the collector terminal from both the layers. In order to further improve not only the off-action speed but also the latch-up withstanding quantity of the IGBT, it is also advantageous to diffuse the collector short layer to substitute a part of the collector layer within a range surrounding the end portion of a gate pattern.

With respect to planar patterns of the semiconductor layer and the gate constituting the IGBT according to the second aspect of the present invention, a pattern surrounding a longitudinally slender gate with a collector layer via a annular emitter region or a pattern surrounding a longitudinally slender collector layer with a gate via the annular emitter region may be adopted. However, it is especially advantageous to arrange the gate and the collector layer in such a pattern that both of them are disposed in the form of comb teeth with the emitter region held therebetween in a zigzag direction.

When the IGBT according to the second aspect of the present invention is manufactured, the diffusion of the base and source layers by means of ion injection for introducing impurities with the gate as a mask is advantageous in not only improving the precision of the diffused patterns of both layers but also reducing the number of process steps. In view of reducing the number of process steps, it is further advantageous to make the collector layer and the base connection layer have the same impurity concentration as well as the same diffusion depth by simultaneously diffusing both the layers of the same conductive type. The IGBT according to the second aspect of the present invention may advantageously be provided with a buffer layer of one conductive type for controlling conductivity modulation in company with the collector layer. The gate is needless to say so disposed as to cover the surface of the base layer on the side of the source layer via the gate oxide film.

As is obvious from FIGS. 1 and 2, in the conventional IGBT, the emitter region formed with the base connection layer 4 and the source layer 6 is disposed on the opposite side of the collector layer 7 with respect to the channel region which is the surface of the base layer 3 beneath the gate 5. According to the second aspect of the present invention, on the other hand, the emitter layer is disposed closer than the channel region to the collector layer, and the base connection layer in the emitter region is disposed closer than the source layer to the collector layer, so that the hole current flowing laterally in the base layer beneath the source layer and causing latch-up, is substantially reduced to zero by extracting a current of holes as minority carriers, which flows from the collector layer into the emitter region, to the base connection layer.

According to the second aspect of the present invention, as noted previously, for example, a p-type base layer is diffused on the surface of an n-type semiconductor region, and a p-type base connection layer is diffused on one side of the base layer in an overlapping manner and then a p-type collector layer is diffused on the surface of the semiconductor region on the same one side. Further, an n-type source layer is shallowly diffused within a range including the surfaces of the base layer and the base connection layer and the boundary therebetween, and a gate is disposed in such a way as to cover the surface of the base layer on the side of the source layer, so that the emitter region formed with the base connection layer and the source layer is disposed on the same side of the collector layer with respect to the channel region beneath the gate.

The hole current from the collector layer is thus allowed to pass through the nearest base layer to the emitter terminal, though a part of it is caused to pass from the base layer through the base connection layer and beneath the source layer. Since the lateral component in the flow path beneath the source layer is produced not in the conventional base layer but in the base connection layer whose impurity concentration is higher by one order or greater than that of the former and whose resistivity is low, almost no injection of holes into the pn junction between the base connection layer and the source layer occurs, whereby the latch-up withstanding quantity of IGBT is made improvable according to the second aspect of the present invention.

BRIEF DESCRIPTION OF THE DRAWINGS

FIGS. 4(a) to 4(f) are enlarged sectional views showing the principal part of the IGBT of FIG. 3 according to the first embodiment of the present invention, illustrating a step-by-step process in which: FIG. 4(a) shows a process of diffusing a base layer and the like; FIG. 4(b) shows a process of diffusing a source layer; FIG. 4(c) shows a process of digging a recess; FIG. 4(d) shows a process of growing polycrystalline silicon and the like for an insulated gate; FIG. 4(e) shows a process of forming the insulated gate; and FIG. 4(f) shows a state in which a collector layer and the like are being diffused;

DETAILED DESCRIPTION OF THE PREFERRED EMBODIMENTS

Referring to the accompanying drawings, preferred embodiments of the present invention will subsequently be described.

Figure 1:
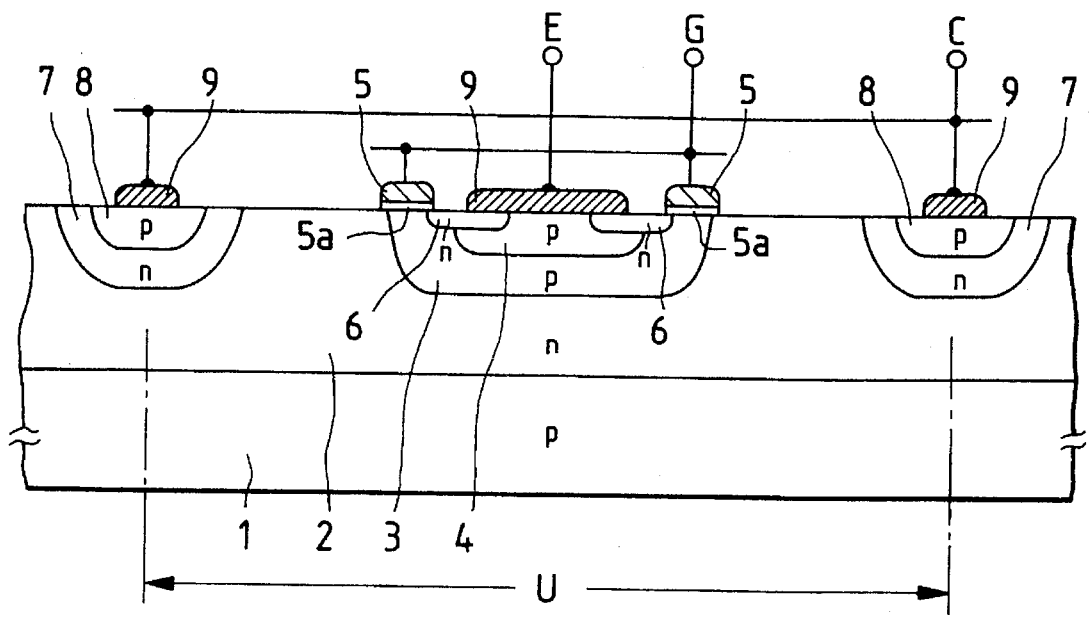
FIG. 1 is a sectional view showing a unit structure of a conventional horizontal IGBT.
Figure 3A:
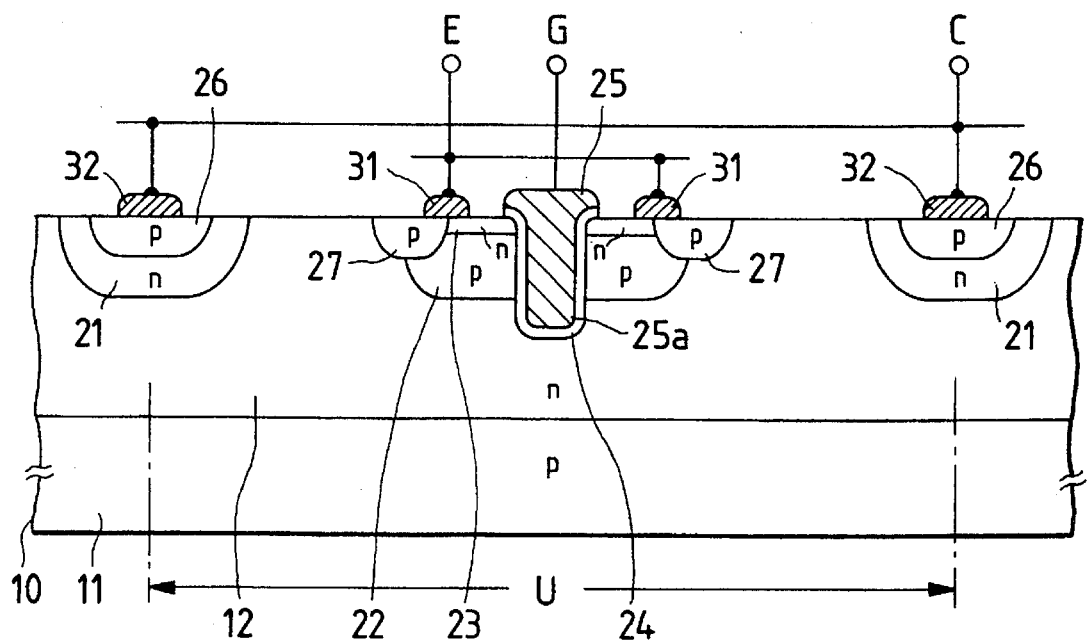
FIG. 3(a) is a sectional view showing a unit structure of an IGBT according to a first embodiment of the present invention.

FIG. 3(a) is a sectional view showing a unit structure U of a horizontal IGBT according to a first embodiment of the present invention, the unit corresponding to that shown in FIG. 1. Similarly to a conventional horizontal IGBT, a chip or wafer 10 for an integrated circuit in which an IGBT is built, is prepared by, for example, growing an n-type epitaxial layer 12 with a predetermined impurity concentration on a p-type semiconductor substrate 11, and the IGBT according to the first embodiment of the present invention is completed by repeatedly fabricating the unit structure U of FIG. 3(a) usually several tens of times in both directions with the epitaxial layer 12 as a semiconductor region for the IGBT and by connecting the units in parallel.

The emitter side shown in the central portion of FIG. 3 features the horizontal IGBT according to the first embodiment of the present invention. A p-type base layer 22 is diffused relatively deep from the surface of the n-type semiconductor region 12, and an n-type source layer 23 with high impurity concentration is diffused shallowly in the inner surface of the base layer 22. Then a trench-like recess 24 is dug from the central surface of the source layer 23 through the base layer 22 up to the semiconductor region 12 beneath the base layer, and the recess 24 is filled with, for example, polycrystalline silicon insulated with a thin oxide film 25a to form an insulated gate 25. In the embodiment shown, a p-type base contact layer 27 with a high impurity concentration is diffused on the surface side of the base layer 22 in such a way as to make the base contact layer overlap the peripheral edge of the base layer and contact with the source layer 23. An electrode film 31 for drawing an emitter terminal E from the base layer 22 and the source layer 23 is so disposed as to short the surfaces of the source layer 23 and base contact layer 27. Moreover, a gate terminal G is connected to the insulated gate 25.

Figure 2:
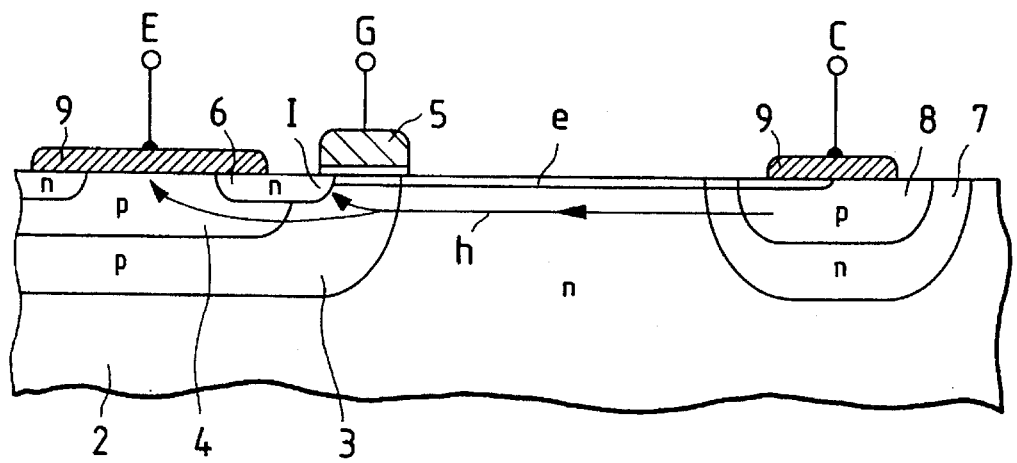
FIG. 2 is an enlarged sectional view showing the principal part illustrating the flow of electrons and holes in the IGBT of FIG. 1.

The collector side shown in both side portions of FIG. 3(a) is of the same structure as a conventional one. The same n-type buffer layer 21 with relatively high impurity concentration is diffused from the surface of the semiconductor region 12 and a p-type collector layer 26 with high impurity concentration is diffused inside the buffer layer, and then a collector terminal C is drawn from an electrode film 32 conductively connected to the collector layer. As shown in FIGS. 1 and 2, in the conventional structure, the collector layer 8 is disposed on the same side of the insulated gate 5 with respect to the source layer 6, whereas the collector layer 26 is disposed on the opposite side of the insulated gate 25 with respect to the source layer 23 in the present invention, which makes the present invention different from the conventional structure.

Figure 3B:
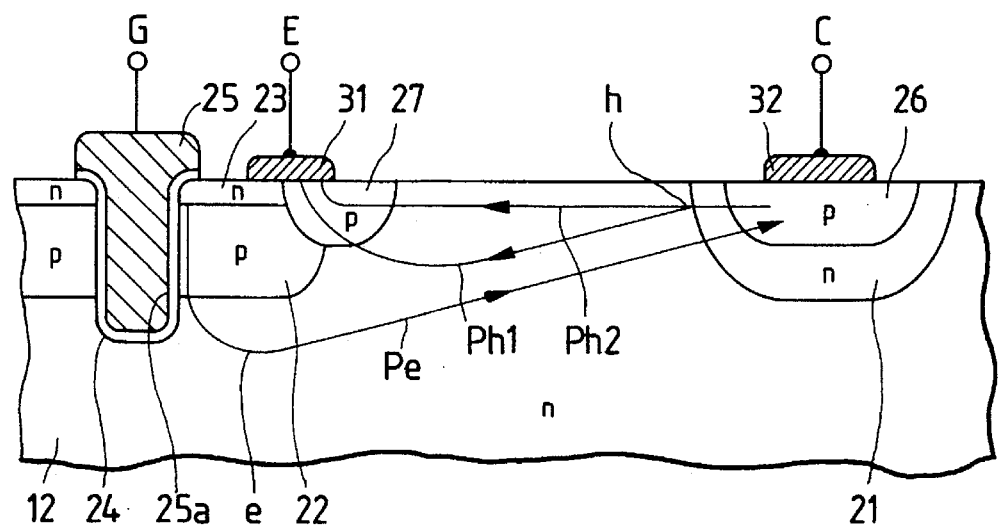
FIG. 3(b) is an enlarged sectional view showing the principal part of FIG. 3(a) illustrating the flow of electrons and holes.

FIG. 3(b), which corresponds to FIG. 2, illustrates flow paths of electrons e as majority carriers and holes h as minority carriers in the on-state of the IGBT thus structured according to the first embodiment of the present invention. Since the insulated gate 25 of the IGBT according to this embodiment is of a buried type, a channel is formed on the surface in contact with the gate oxide film 25a on the side of the recess 24 of the base layer 22. Consequently, the electrons e pass through the channel from the source layer 23 and flow into the portion of the semiconductor region 12 under the base layer 22, and then into the collector layer 26 via a tilted flow path indicated by Pe and the buffer layer 21. The inflow of such electrons e causes the holes h to be produced from the collector layer 26 to be injected via the buffer layer 21 into the semiconductor region 12. Then a part of the holes h flows through an inner flow path Ph1 due to the Coulomb's force from the electrons e, whereas the remaining holes flow through a surface flow path Ph2. These holes then enter the base contact layer 27 as illustrated and are pulled toward the electrode film 31 on the surface thereof. Conductivity modulation action similarly takes place between the holes h and the electrons e in this on-state as in the case of the conventional structure.

As described above, since the collector layer 26 is disposed opposite to the insulated gate 25 with respect to the source layer 23 according to the first embodiment of the present invention, the place where the holes h are extracted is located on the same side of the collector layer 26 with respect to the source layer 23 as shown in FIG. 3(b). Therefore, there is little possibility that the holes h laterally pass through the base layer 22 beneath the source layer 23 and are injected into the source layer 23 due to the forward bias at the pn junction therebetween. Thus, the latch-up withstanding quantity is improved. Especially in the example of providing the base contact layer 27 with high impurity concentration as shown in FIG. 3(a), since the resistivity of the base contact layer 27 is far lower than that of the base layer 22, the possibility of the injection of holes h into the source layer due to the forward bias at the pn junction is further reduced, and this makes it possible to enhance the effect of improving the latch-up withstanding quantity.

The electrons e and holes h remaining in the semiconductor region 12 are swept out when the IGBT is turned off and a depletion layer expands. When the IGBT according to this embodiment is turned off and after the supply of electrons e stops, the influence of the Coulomb's force to the hole h sharply decreases and most of the holes h are extracted via the surface flow path Ph2. Consequently, the possibility of causing the holes h to be injected into the source layer 23 in the off-state is made further lower than in the on-state and the latch-up withstanding quantity of the horizontal IGBT can be increased according to this embodiment. The latch-up withstanding quantity of the horizontal IGBT of this embodiment is thus made several times greater than that of a conventional IGBT in the on-state and it can be also increased by about one order in the off-state. Moreover, the turn-off time of the IGBT of this embodiment can be reduced. In other words, although turn-off characteristics are determined by the time required to sweep out holes h whose movability is lower than that of electrons e, the drift time is shortened to the extent that the place where the holes h are extracted is closer to the collector layer 26 than a conventional IGBT. The turn-off time may be shortened by 20%–30% though it varies with the withstand voltage values of IGBTs.

Referring to FIG. 4, a description will subsequently be given of a process of producing the IGBT of FIG. 3 according to the present invention. FIG. 4(a) illustrates a process of diffusing the base layer 22. In FIG. 4(a), there is shown only the n-type semiconductor region 12 as an epitaxial layer in the wafer 10 and when the withstand voltage of the IGBT is about 300 V, the semiconductor region 12 is made at least 10 µm—several tens µm thick at a resistivity of about 40 Ωcm. In the example shown, the n-type buffer layer 21 for use as a collector layer is first diffused, for example, as deep as 4 µm with an impurity concentration of $10^{17}$ atom/cm$^3$, and then the p-type base layer 22 is diffused, for example, as deep as 3–4 µm with an impurity concentration of $10^{17}$ atom/cm$^3$. In both cases, impurity ion injection and thermal diffusion may be utilized with photoresist as a mask.

Figure 4A:
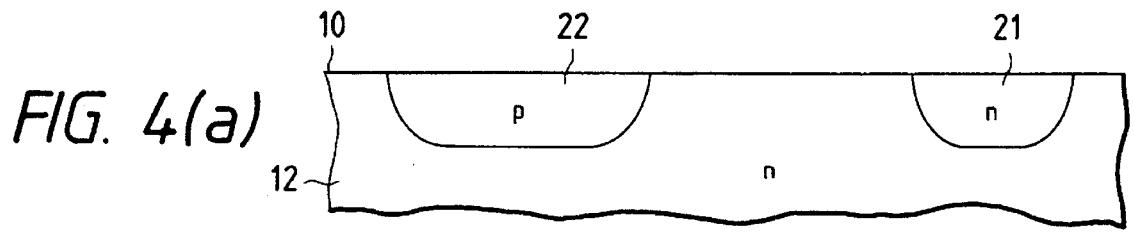
Figure 4B:
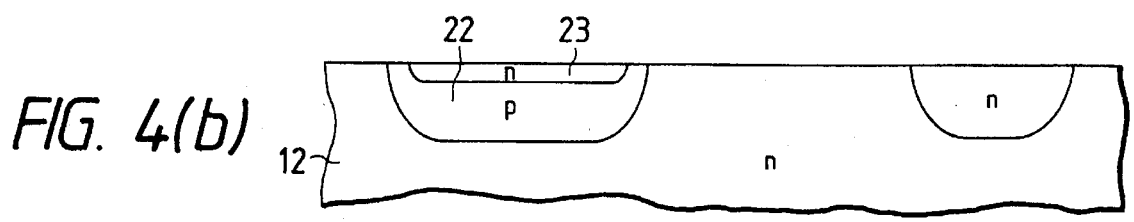
Figure 4C:
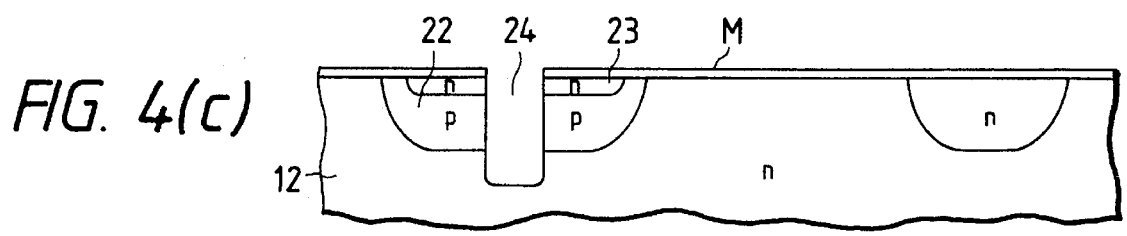

FIG. 4(b) illustrates a process of diffusing the source layer 23. The diffusion pattern is set smaller than the base layer 22 as shown therein and by, for example, diffusing arsenic as an n-type impurity to a depth of about 0.1 µm and with a high impurity concentration of at least $10^{19}$ atom/cm$^3$, the source layer 23 is fabricated in the surface portion inside the base layer 22. FIG. 4(c) illustrates a process of digging the recess 24. In order to dig the trench-like recess 24 as shown therein, reactive-ion etching is advantageous. First, a window 3 µm wide, for example, is opened in a place where the recess 24 is dug after a low-temperature oxide film 1–1.5 µm thick as a mask M is applied thereon, and then reactive-ion etching is carried out for about 30 minutes and in an atmosphere of about 10 Pa of an etching gas which is a mixture of silicon tetrachloride and nitrogen. Then the recess 24 as deep as, for example, 4–6 µm is dug in such a way that it passes from the surface of the central portion of the source layer 23 via the base layer 22 up to the semiconductor region 12 thereunder. After this process of FIG. 4(c), the mask M is removed.

Figure 4D:
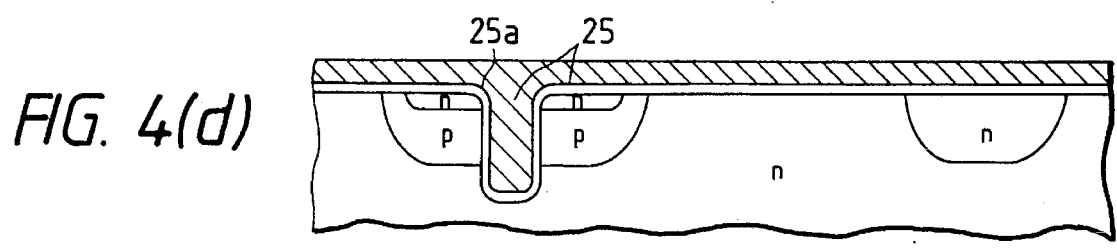
Figure 4E:
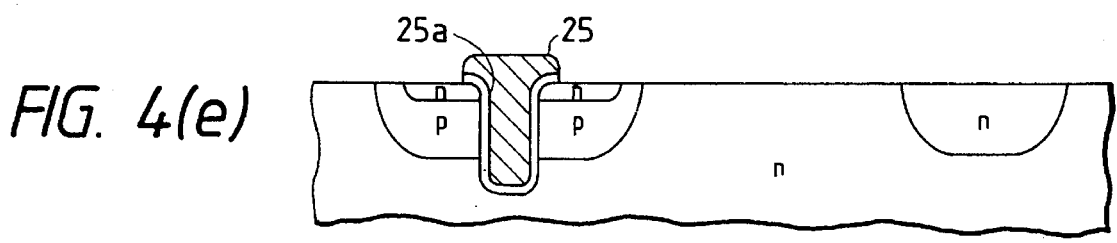

FIG. 4(d) illustrates a process of coating the gate oxide film 25a for the insulated gate 25 and growing polycrystalline silicon. First, the gate oxide film 25 as thin as about 0.1 µm is applied by thermal oxidation to the surface including the recess 24 and then impurity-doped polycrystalline silicon of, for example, 2 µm thickness is grown by CVD for use as the insulated gate 25 so as to fill up the recess 24 completely. FIG. 4(e) illustrates a process of removing the unnecessary portion of the polycrystalline silicon. First the unnecessary portion of the polycrystalline silicon is removed by dry etching with photoresist as a mask, and then that of the gate oxide film 25a is also removed by simple wet etching using a fluorine aqueous solution, whereby the insulated gate 25 with a cross section as shown in FIG. 4(e) is formed.

Figure 4F:
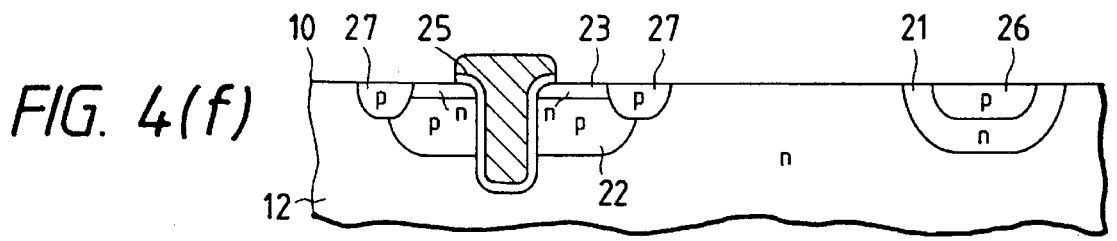

According to this embodiment, the p-type base contact layer 27 of the same p-type is diffused concurrently with the collector layer 26 as shown in FIG. 4(f). As shown in FIG. 4(f), the contact layer 26 is diffused in the buffer layer 21, and the base contact layer 27 is diffused as deep as 1–1.5 µm, for example, with a high impurity concentration of $10^{18}$ atom/cm$^3$ on the surface side of the base layer 22 in such a way as to make the base contact layer overlap the peripheral edge of the base layer and contact with the source layer 23. The diffusion process of producing the semiconductor layers is ended in FIG. 4(f). In order to change the state of FIG. 4(f) to the completion state shown in FIG. 3, the surface of the wafer 10 is coated with an interposed insulating film and the like and then a window is opened in a desired portion. Further, the aluminum electrode films 31 and 32 are disposed for the emitter and collector terminals E and C, respectively. Then the electrode film for the gate terminal G is disposed in a place other than the cross section shown therein and the whole surface is covered with an ordinary protective film.

Figure 5:
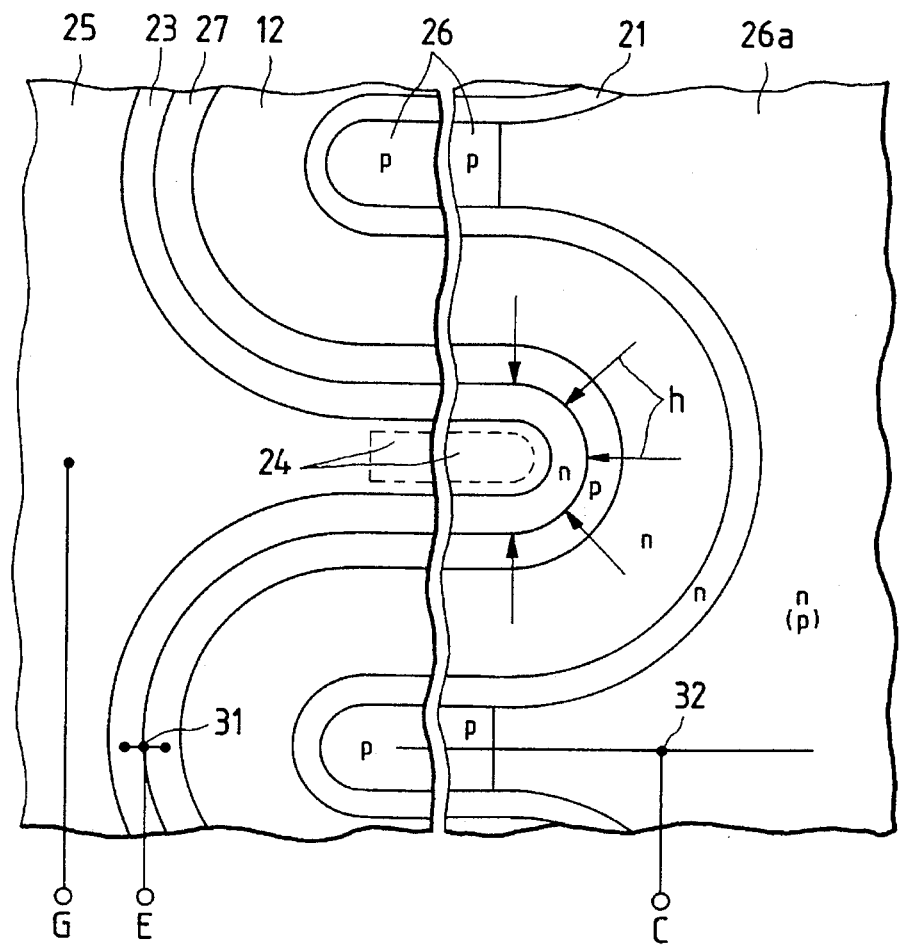
FIG. 5 is an enlarged top view showing the principal part of an IGBT according to a second embodiment of the present invention together with a planar pattern of the IGBT according to the embodiment of FIG. 3.

Referring to a partial enlarged top view of an IGBT in FIG. 5, a second embodiment of the present invention will subsequently be described. The vertical direction of FIG. 5 is equivalent to the horizontal direction of FIG. 3 and the central portion with respect to the horizontal direction of FIG. 5 has been omitted for convenience. Also, FIG. 5 shows a state in which the electrode films 31 and 32 in FIG. 3 are removed. The buried portion of the insulated gate 25 in the recess 24 looks like long slender comb teeth in the horizontal direction and the comb teeth are coupled through the polycrystalline silicon of the insulated gate 25 covering the surface on the left-hand side of FIG. 5. In other words, the insulated gate 25 is of comb teeth structure in which the gate terminal G has been drawn from the coupled portion. The collector layer 26 has also been diffused into a pattern in which an auxiliary collector layer 26a is used to couple the long slender p-type comb teeth portions in the horizontal direction of FIG. 5. Since the auxiliary collector layer 26a is of the p-type originally as shown by (p) in FIG. 5, the collector layer 26 and the insulated gate 25 are in a zig-zag form like comb teeth.

The surface of the semiconductor region 12, the buffer layer 21, the source layer 23 and the base contact layer 27 which exist between the insulated gate 25 and the collector layer 26 are in a zigzag form. As noted previously, the emitter terminal E is drawn from the source layer 23 and the base contact layer 27, and the collector terminal C is drawn from the collector layer 26. However, the holes h concentrate in the neighborhood of the leading end of the pattern of the source layer 23 from the collector layer 26 surrounding the leading end as shown by arrows in FIG. 5, so that the leading end thereof becomes a place where latch-up tends most likely to occur due to the injection of holes h. According to the embodiment of FIG. 5, the auxiliary collector layer 26a of n-type instead of p-type is diffused in that portion of the collector layer 26 surrounding the leading end of the pattern of the source layer 23 with special attention to that fact of concentration. The surface of the collector layer 26 together with the auxiliary collector layer 26a is shorted by means of the electrode film 32 of FIG. 3 to form the collector terminal C. As a result, the portion in which the auxiliary collector layer 26a of the same n-type as that of the source layer 23 has been diffused, is used as a field effect transistor free from latch-up. The latch-up withstanding quantity of the IGBT can be improved further than the embodiment of FIG. 3 which does not include the n-type auxiliary collector layer 26a. Therefore, the n-type auxiliary collector layer 26a is preferred, though the p-type one is acceptable.

Figure 6:
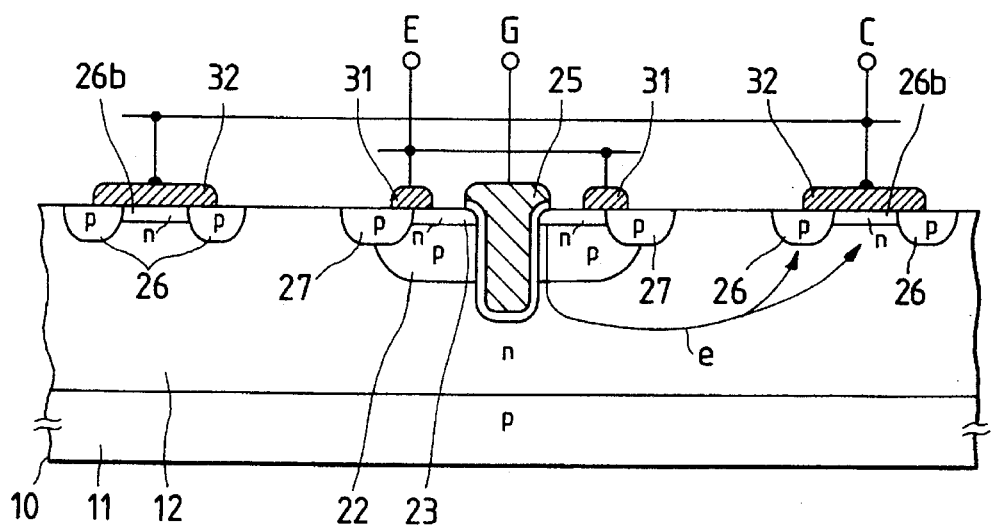
FIG. 6 is a sectional view showing a unit structure of an IGBT according to a third embodiment of the present invention.

FIG. 6 shows a third embodiment shown by a sectional view corresponding to FIG. 3(a). As shown in FIG. 6, though the emitter side in the central portion is similar to that of the first embodiment shown in FIG. 3, an n-type auxiliary collector layer 26b is diffused on the collector side in such a way that it is in contact with the p-type collector layer 26 and surrounded therewith. Further, the electrode film 32 is used to short the auxiliary collector layer 26b and the surface of the collector layer 26 so as to form the collector terminal C. The auxiliary collector layer 26b may be diffused simultaneously with the source layer 23. Since a considerable quantity of electrons e flow toward the auxiliary collector layer 26b according to this third embodiment, the latch-up withstanding quantity is improvable as the number of holes h is reduced, though the on-voltage of the IGBT slightly rises.

As described above, the horizontal IGBT according to the first to third embodiments of the present invention is completed through the steps of diffusing the base layer of the other conductive type from the surface of the semiconductor region of one conductive type, diffusing the source layer of one conductive type in the surface of the base layer, digging the recess from the surface of the source layer through the base layer up to the semiconductor region, burying the recess with the insulated gate, and diffusing the collector layer of the other conductive type from the surface of the semiconductor region on the opposite side of the insulated gate with respect to the source layer. Consequently, the following effects are achievable.

(a) The collector layer can be disposed on the opposite side of the insulated gate with respect to the source layer by burying the insulated gate in the recess. Thus, the minority carriers which may cause latch-up are directly extracted from the base or contact layer into the emitter terminal without allowing them to laterally pass under the source layer as in the conventional structure in which the collector layer is disposed on the same side as the insulated gate with respect to the source layer, whereby the latch-up withstanding quantity can be improved by almost completely preventing the minority carriers from being injected into the source layer. Especially in the embodiment of providing the contact layer with high impurity concentration and low resistivity for the base layer, the latch-up withstanding quantity is further improvable as most of the minority carriers can be extracted therethrough.

(b) The Coulomb's force affecting the holes is reduced after the supply of electrons to the semiconductor region is stopped in the turn-off of the IGBT and most of the holes are extracted via the flow path near the surface of the semiconductor region. Therefore, the risk of injection of holes into the source layer is less than that in the on-state, so that the latch-up withstanding quantity in the turn-off of the IGBT may be made far greater than a conventional one.

(c) The collector layer is disposed opposite to the insulated gate with respect to the source layer and a place where the holes are extracted is located on the same side of the collector layer with respect to the source layer, that is, the place is set closer to the collector layer, whereby the drift time of holes whose movability is lower than that of electrons in the semiconductor region is shortened in the offstate of the IGBT. As a result, the holes are swept out of the semiconductor region and the depletion layer is expanded in a short time. Thus, the turn-off time of the IGBT becomes shortened and the applicable frequency is increased.

The horizontal IGBT having the features stated above is suitable for being built up in an integrated circuit device and may be provided with a withstand voltage of as high as several hundred volts and a current capacity of 1 A or greater in addition to the above mentioned superior latch-up withstanding quantity and the turn-off characteristics.

Figure 7A:
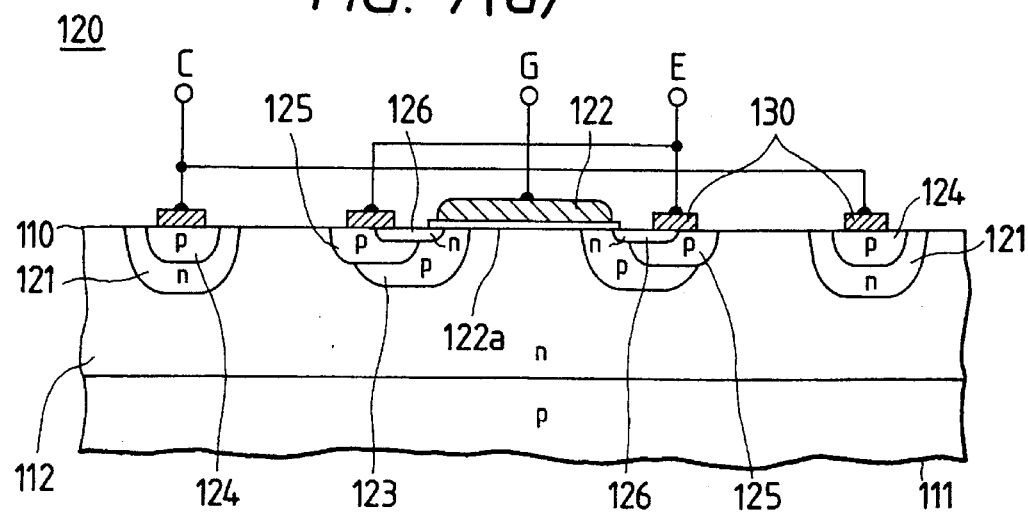
FIG. 7(a) is a sectional view showing a unit structure of an IGBT according to a fourth embodiment of the present invention.

FIG. 7(a) is a sectional view of an IGBT 120 according to a fourth embodiment of the present invention whose unit structure corresponds to that shown in FIG. 1. Even the IGBT 120 according to the present embodiment is completed by repeating the process of providing the unit structure in both directions of FIG. 7(a) plural times. A wafer 110 incorporating the IGBT 120 according to the fourth embodiment is, like a conventional one, prepared by, for example, growing an epitaxial layer of several tens μm thickness as a semiconductor region 112 in a p-type semiconductor substrate 111 and the semiconductor region 112 should preferably have a relatively high resistivity of 10 Ωcm. As the IGBT 120 according to the present embodiment employs a buffer layer 121 on the collector side, the n-type buffer layer 121 which has an impurity concentration of, for example, $10^{16}$ atom/cm$^3$ and which is 5 µm deep, is first diffused from the left- and right-hand sides of the surface of the semiconductor region 112 and a gate 122 of polycrystalline silicon about 0.5 µm thick is disposed in the central portion of the semiconductor region 112 via a very thin gate oxide film 122a of about 0.1 µm.

Subsequently, a p-type base layer 123 which has a impurity concentration of, for example, $10^{17}$ atom/cm$^3$ and which is 4 µm deep, is so diffused from both sides of the gate 122 as to slip thereunder. The base layer 123 should preferably be built by injecting and heat-diffusing boron ions with the gate 122 as a part of a mask. Then a collector layer 124 within the buffer layer 121 and a base connection layer 125 partially overlapping the base layer 123 are built by simultaneously diffusing boron so that both layers have a high impurity concentration of $10^{18}$–$10^{19}$ atom/cm$^3$ and a depth of about 2 µm. Further, an n-type source layer 126 is built at both sides of the gate 122 by injecting and heat-diffusing arsenic ions with the gate 122 as a part of a mask so that it has a high impurity concentration of $10^{20}$ atom/cm$^3$ and a depth of about 0.2 82 m, and the source layer is made into a pattern including the boundary between the base layer 123 and the base connection layer 125 as shown in FIG. 7(a). The channel region is formed in the surface of the base layer 123 beneath the gate 122 between the source layer 126 and the semiconductor region 112.

The fabrication of the semiconductor layers of the IGBT 120 is thus completed, and then aluminum electrode films 130 for use as terminals are disposed in places desired as shown in FIG. 7(a). The electrode films 130 are used to short the surfaces of the base connection layer 125 and the source layer 126 and then an emitter terminal E is drawn therefrom. Further, a gate terminal G and a collector terminal C are drawn from the electrode films 130 respectively in conductive contact with the gate 122 and the collector layer 124. The horizontal IGBT 120 is thus completed. In this case, an electrode film for the gate 122 is provided in a portion other than what is shown in the sectional view of FIG. 7(a). Although an insulating film and a protective film are needless to say provided in addition to those shown in FIG. 7(a), the description of them has been omitted for simplification.

Figure 7B:
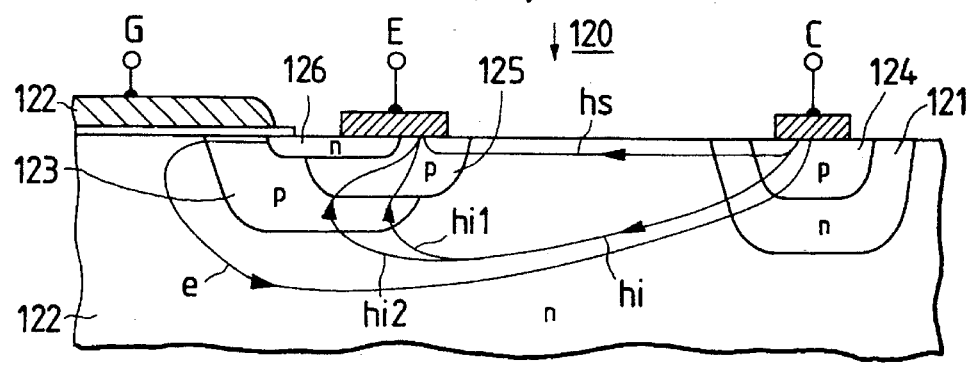
FIG. 7(b) is a sectional view showing carrier flow paths in the IGBT of FIG. 7(a)

Referring to FIG. 7(b) of an enlarged sectional view showing the right-hand half of FIG. 7(a), the operation of the IGBT 120 according to the fourth embodiment will subsequently be described. As is obvious from the description made until now, the IGBT according to the present embodiment is so structured that, unlike the conventional one, the emitter region formed with the base connection layer 125 and the source layer 126 from which the emitter terminal E is drawn, is built on the same side as the collector layer 124 with respect to the channel region on the surface of the base layer 123 beneath the gate 122. When the n-type channel beneath the gate 122 is caused to conduct by giving a positive potential with respect to the emitter terminal E to the gate terminal G, electrons e as majority carriers first pass from the source layer 126 through the channel, enter the semiconductor region 112, and then flow within a range fairly deeper than a convention one under the base layer 123 toward the collector layer 124.

As the electrons e flow into the collector layer 124, the holes as minority carriers are conversely injected into the semiconductor region 112. According to the present embodiment, however, the flow path of the holes is, as shown in FIG. 7(b), divided between an inner flow path hi attracted by the Coulomb's force to the electron path to extend through the inside of the semiconductor region 112 and a surface flow path hs extending along the surface of the semiconductor region 112 toward the base connection layer 125 situated closest to the collector layer 124. The components in the neighborhood of the surface flow path hs in such hole currents are extracted from the semiconductor region 112 into the base connection layer 125, whereas those in the neighborhood of the inner flow path hi are allowed to enter the base connection layer 125 via the base layer 123. The latter components are slightly greater in quantity than the former immediately after the IGBT 120 is turned on. However, the components in both flow paths above are considered substantially the same in quantity in its complete on-state where conductivity modulation is brisk.

According to the fourth embodiment, the risk of latch-up is reduced by directly extracting the components of the hole current near the surface flow path hs in the semiconductor region 112 into the base connection layer 125. The remaining problem is concerned with the components of the hole current passing near the inner flow path hi. They flow while being distributed between the flow paths indicated by hi1 and hi2 in the base layer 123 and the base connection layer 125 as shown in FIG. 7(b). The components near the flow path hi2 in particular have lateral current components under the source layer 126. However, the risk of allowing the holes to enter the pn junction of the source layer 126 is minimized since the lateral hole current flowing under the source layer 126 is caused to flow through the base connection layer 125 whose resistivity is far lower than that of the base layer 123. As described above, the components of the hole current near the surface flow path hs are extracted into the base connection layer 125, whereas the components near the inner flow path hi under the source layer 126 are allowed to pass through the base connection layer 125 with a low resistivity, so that the possibility of occurrence of latch-up is reduced far greater than a conventional IGBT.

When the IGBT 120 is in the off state, the potential of the gate terminal G is eliminated to make the channel region beneath the gate 122 non-conducting. As a result, electrons e are prevented from flowing into the semiconductor region 112 and the remaining electrons e therein are absorbed by the collector layer 124. The density of the electrons e in the semiconductor region 112 lowers and also the percentage of the components of the hole current that has been attracted by the Coulomb's force and that is existing near the inner flow path hi decreases, whereas the percentage of the components thereof near the surface flow path hs increases. A depletion layer then extends in the semiconductor region 112 after the components of the latter have completely extracted by the base connection layer 125; the IGBT 120 is thus turned off completely. Obviously, there is very little risk of causing latch-up to occur when the IGBT 120 according to the fourth embodiment of the present invention is in the off state, and this makes it possible to particularly improve latch-up withstanding quantity against foreign noises which are apt to penetrate into the emitter terminal while the IGBT 120 is in the off-operation.

Figure 8:
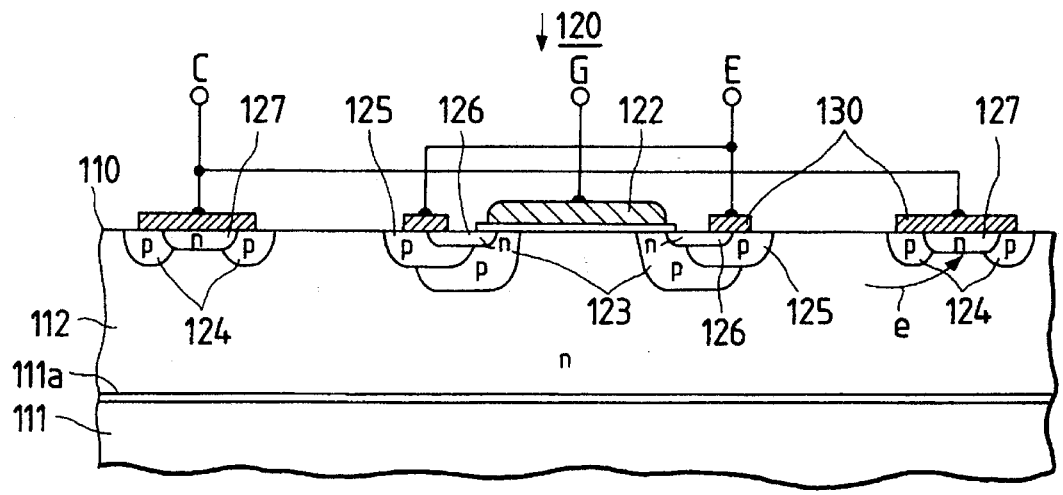
FIG. 8 is a sectional view showing an IGBT according to a fifth embodiment of the present invention with the provision of a collector short layer.

In a fifth embodiment shown in FIG. 8, in order to increase a turn-off speed of the IGBT 120, the collector region is of collector short structure. As shown in FIG. 8, an n-type collector short layer 127 is built in such a way that it adjoins the p-type collector layer 124 and the collector terminal C is drawn after the surfaces of both layers are shorted with the electrode films 130. Moreover, a substrate junction type wafer which is prepared by joining a substrate 111 and an n-type substrate for the semiconductor region 112 with an oxide film 111a held therebetween is employed as the wafer 110 for the IGBT 120 in this embodiment of FIG. 8. The remaining structure is similar to that of the fourth embodiment. According to this embodiment, the quantity of holes to be reversely injected is reduced so as to shorten the off action time by extracting electrons e as majority carriers remaining in the semiconductor region 112 into the collector short layer 127 while the IGBT 120 is performing the off action. In this case, it is advantageous to provide the collector short layer 127 sandwiched by the collector layers 124 as shown in FIG. 8. In addition, the collector region may be of composite structure including the buffer layer 121 according to the fourth embodiment.

Figure 9:
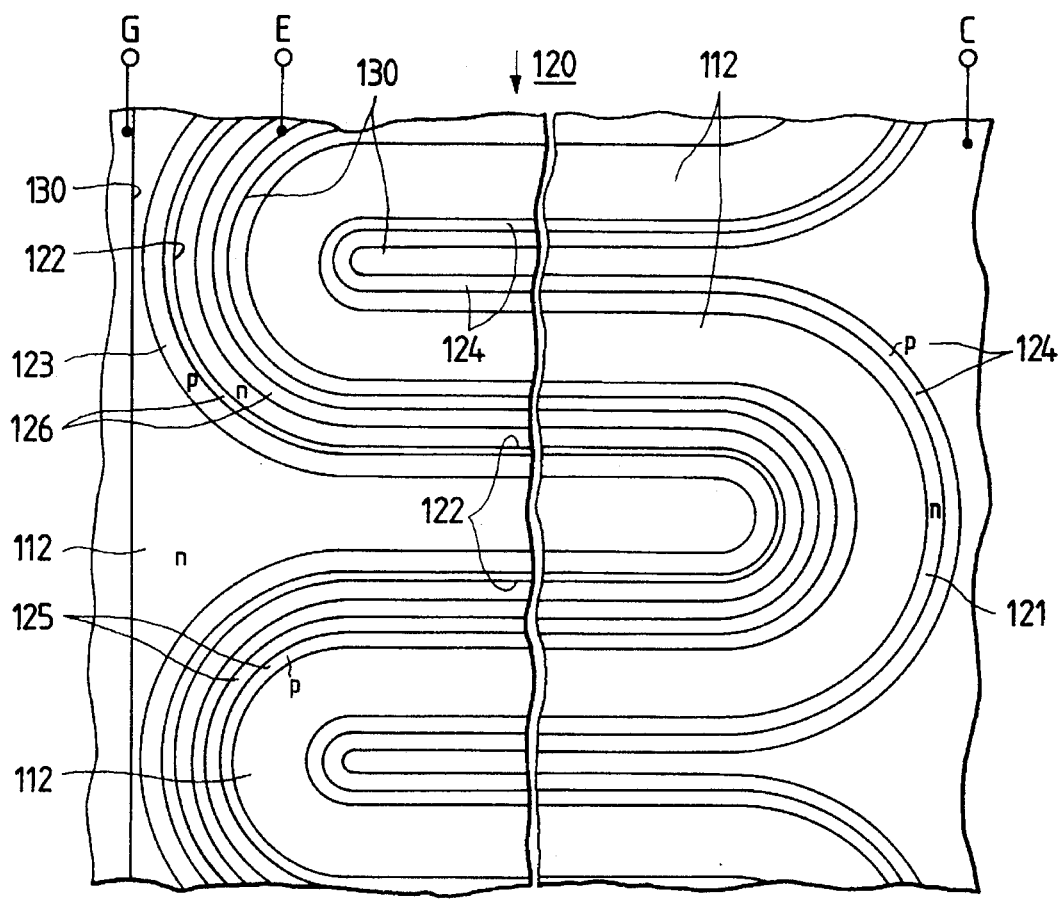
FIG. 9 is a top view showing an IGBT according to a sixth embodiment of the present invention with a gate and a collector layer which are disposed in the form of comb teeth.

FIG. 9 is a top view showing such a pattern corresponding to the structure of the fourth embodiment that the channel region and the collector region are interlaced with each other in the form of comb teeth according to a sixth embodiment. Although the comb teeth are formed into strips of regions in the lateral direction, the central portion has been omitted in FIG. 9. As shown in FIG. 9, the gate 122 covering the channel region protrudes from left to right in the form of comb teeth, whereas the collector region including the buffer layer 121, the collector layer 124 and the electrode films 130 thereon protrude from right to left in the form of comb teeth. The emitter region including the source layer 126, the base connection layer 125 and the electrode films 130 thereon, and the exposed surface of the semiconductor region 112 are disposed in a zigzag comb teeth pattern.

According to the sixth embodiment, the gate terminal G is easily drawn from the electrode film 130 on the gate 122 on the left-hand side of FIG. 9, and the collector terminal C is also drawn easily from the electrode film 130 on the collector layer 124 on the right-hand side of FIG. 9. The emitter terminal E is also readily drawn from a proper spot of the electrode film 130 on the emitter region. One of the advantages of this embodiment is that when the IGBT is formed into an integrated circuit device, its chip area can be saved. The plane pattern of the IGBT according to the present invention may be formed such that a slender strip of a gate is surrounded with a collector layer via an annular emitter region, or a slender strip of a collector layer is surrounded with a gate via an annular emitter region, though such plane pattern of the IGBT does not allow the terminal to be drawn easily as compared with the sixth embodiment.

Figure 10:
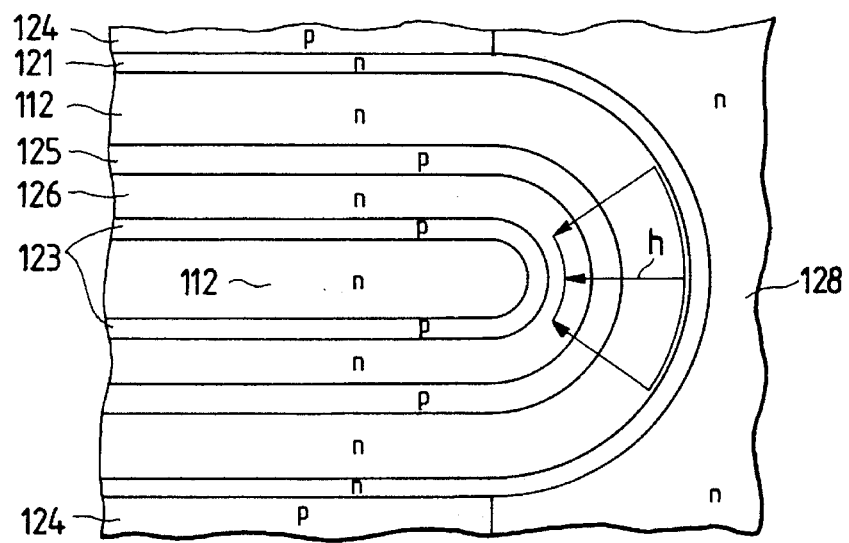
FIG. 10 is a sectional view showing an IGBT according to a seventh embodiment of the present invention with a collector short layer provided in a range surrounding the end portion of a gate pattern.

FIG. 10 is a top view showing a seventh embodiment which corresponds to the right-hand side of FIG. 9. In FIG. 10, there is shown a pattern of the semiconductor layer excluding the gate 122, the electrode films 130 and the like from FIG. 9. The central portion of FIG. 10 includes the semiconductor region 112 and the base layer 123 covered with the gate whose end portion is equivalent to the right end of the combination. There are the surface of the semiconductor region 112 and the emitter region including the source layer 126 and the base connection layer 125 so as to surround the end portion. The buffer layer 121 is diffused outside the aforesaid layers. If the p-type collector layer 124 is further diffused outside the buffer layer 121 with the right-hand end portion included, the current of holes h injected into the semiconductor region 112 tends to concentrate on the emitter region with high density as shown by a fan shape in FIG. 10, thus causing latch-up therein. For this reason, an n-type collector short layer 128 instead of the p-type collector layer 124 is diffused within a range corresponding to the end portion of the gate according to the seventh embodiment, and the electrode film for the collector terminal is used to short the surfaces of both layers 124 and 128. Conductivity modulation is thereby prevented as no holes are injected into the range surrounding the end portion of the gate, and the weak point is thus eliminated though the current carrying capacity of the IGBT slightly decreases to that extent. Accordingly, the latch-up withstanding quantity can thus be improved.

The aforesaid IGBTs according to the fourth to seventh embodiments, which are of the horizontal type, are capable of providing a withstand voltage of 200 V or higher and a current capacity of several A or greater, to say nothing of being readily assembled into a integrated circuit. Moreover, the IGBT having not only a low on-voltage of about 2 V but also a short off-action time of 2—several μS can be obtained.

Incidentally, the conductive types, numerical values relating to their impurity concentration, diffusion depth and the like, and the diffusion patterns of semiconductor layers constituting the IGBT according to the various embodiments of the present invention have been referred to merely as examples, and the present invention is not restricted by them but may be practiced otherwise within the scope and spirit thereof.

As described above, the IGBT according to the fourth to seventh embodiments of the present invention is prepared through the steps of diffusing the base layer of the other conductive type from the surface of the semiconductor region of one conductive type, diffusing the base connection layer of the other conductive type on one side of the base layer in an overlapping manner, diffusing the source layer of one conductive type within a range including the base layer, the base connection layer and the boundary therebetween, disposing the gate in such a way as to cover the surface of the base layer on a side of the source layer, and diffusing the collector layer of the other conductive type in the semiconductor region on one side of the base connection layer, wherein the emitter terminal is drawn from the base connection layer and the source layer, the collector terminal from the collector layer, and the gate terminal from the gate. Therefore, the following effects are achievable.

(a) Unlike the prior art, the emitter region is arranged closer to the side of the collector layer than the channel region so as to reduce the hole current flowing under the source layer by directly extracting the hole current, which flows from the collector layer into the emitter region, into the base connection layer. Further, the hole current components passing under the source layer in the lateral direction are allowed to flow only in the base connection layer whose resistivity is relatively low so as to prevent the holes to be injected into the pn junction of the source layer. Thus, the latch-up withstanding quantity of the horizontal IGBT can be improved.

(b) Since the most part of the hole current is caused to flow to the surface of the semiconductor region when the IGBT performs the off-action, and are quickly extracted into the base connection layer, the risk of causing latch-up to occur considerably decreases and this makes it possible to particularly improve the latch-up withstanding quantity against foreign noises which are apt to penetrate into the emitter terminal as the off-action is performed. Moreover, the off-action time of the IGBT can be reduced far greater than a conventional IGBT.

Particularly, the present invention has the effects of improving the latch-up withstanding quantity and off-action characteristics when applied to horizontal IGBTs to be incorporated in integrated circuit devices in particular.

What is claimed is:

1. An insulated-gate bipolar transistor, comprising:

a semiconductor region of a first conductive type;

a base layer of a second conductive type in a surface portion of said semiconductor region;

a base connection layer of the second conductive type in said semiconductor region on one side of said base layer overlapping said base layer, said base connection layer contacting said semiconductor region, and said base connection layer having a lower resistivity than said base layer;

a source layer of the first conductive type shallowly diffused within a range including surfaces of said base layer and said base connection layer and a boundary between said base layer and said base connection layer;

a gate electrode covering a surface of said base layer on a side of said source layer;

a collector layer of the second conductive type in a surface portion of said semiconductor region on one side of said base connection layer;

an emitter terminal electrically and physically connected to said base connection layer and electrically connected to said source layer;

a collector terminal electrically connected to said collector layer; and a gate terminal electrically connected to said gate electrode.

2. An insulated-gate bipolar transistor as claimed in claim 1, further comprising a collector short layer of the first conductive type diffused toward said collector layer from a surface of said semiconductor region adjoining to said collector layer, said collector terminal being electrically connected to said collector short layer.

3. An insulated-gate bipolar transistor as claimed in claim 2, wherein said collector short layer is diffused within a range surrounding an end portion of said gate electrode.

4. An insulated-gate bipolar transistor as claimed in claim 1, wherein said gate electrode and said collector layer are interlaced with each other in a comb teeth pattern.

5. An insulated-gate bipolar transistor as claimed in claim 1, wherein said base layer and said source layer are diffused layers by ion injection for introducing impurities with said gate electrode as a mask.

6. An insulated-gate bipolar transistor, comprising:

a semiconductor region of a first conductive type having a surface;

a base layer of a second conductive type in a surface a source layer of the first conductive type in a surface portion of said base layer having a surface;

an insulated gate electrode buried in a recess extending from the surface of said source layer through said base layer to said semiconductor region;

a collector layer of the second conductive type in a surface portion of said semiconductor region, said collector layer and said source layer being on the same side of said insulated gate electrode;

an emitter terminal electrically connected to said base layer and said source layer;

a collector terminal electrically connected to said collector layer;

a gate terminal electrically connected to said insulated gate; and a base contact layer of the second conductive type on a surface side of said base layer in such a way as to make said base contact layer overlap a peripheral edge of said base layer and contact said source layer, said base contact layer having a surface opposing the collector layer contacting said semiconductor region, and said base contact layer having a lower resistivity than said base layer, said emitter terminal being physically and electrically connected to said base contact layer, and said emitter terminal being electrically connected to said base layer via said base contact layer.

7. An insulated-gate bipolar transistor as claimed in claim 1, further comprising a buffer layer of the first conductive type surrounding said collector layer.

8. An insulated-gate bipolar transistor as claimed in claim 1, further comprising an auxiliary collector layer of the first conductive type, said collector layer surrounding said auxiliary collector layer, and said collector terminal being electrically connected to said auxiliary collector layer.

9. An insulated-gate bipolar transistor as claimed in claim 1, further comprising an auxiliary collector layer of the first conductive type in a surface portion of said semiconductor region in contact with said collector layer, said collector terminal being electrically connected to said auxiliary collector layer.

* * * * *

UNITED STATES PATENT AND TRADEMARK OFFICE
CERTIFICATE OF CORRECTION

PATENT NO. : 5,572,055
DATED : November 05, 1996
INVENTOR(S) : Hitoshi SUMIDA

It is certified that error appears in the above-indentified patent and that said Letters Patent is hereby corrected as shown below:

```
Claim 6, column 16, line 3, after "surface", insert
--portion of said semiconductor region;--.
```

Signed and Sealed this

Tenth Day of June, 1997

Attest:

BRUCE LEHMAN

*Attesting Officer*         Commissioner of Patents and Trademarks